US010566181B1

(12) United States Patent
Mori

(10) Patent No.: US 10,566,181 B1
(45) Date of Patent: Feb. 18, 2020

(54) SUBSTRATE PROCESSING APPARATUSES AND SUBSTRATE PROCESSING METHODS

(71) Applicant: ASM IP Holding B.V., Almere (NL)

(72) Inventor: Yukihiro Mori, Machida (JP)

(73) Assignee: ASM IP HOLDING B.V., Almere (NL)

( * ) Notice: Subject to any disclaimer, the term of this patent is extended or adjusted under 35 U.S.C. 154(b) by 0 days.

(21) Appl. No.: 16/053,740

(22) Filed: Aug. 2, 2018

(51) Int. Cl.
*H01J 37/32* (2006.01)
*H01L 21/02* (2006.01)
*H01L 21/67* (2006.01)
*H01L 21/687* (2006.01)
*B08B 7/00* (2006.01)
*C23C 16/50* (2006.01)
*C23C 16/458* (2006.01)
*H01L 21/311* (2006.01)
*G02F 1/13* (2006.01)

(52) U.S. Cl.
CPC ...... *H01L 21/02079* (2013.01); *B08B 7/0035* (2013.01); *C23C 16/4584* (2013.01); *C23C 16/50* (2013.01); *H01J 37/3244* (2013.01); *H01J 37/32532* (2013.01); *H01J 37/32715* (2013.01); *H01L 21/0209* (2013.01); *H01L 21/02087* (2013.01); *H01L 21/02115* (2013.01); *H01L 21/02274* (2013.01); *H01L 21/31122* (2013.01); *H01L 21/67028* (2013.01); *H01L 21/67253* (2013.01); *H01L 21/68764* (2013.01); *G02F 1/1303* (2013.01); *G02F 2001/1316* (2013.01); *H01J 37/32091* (2013.01); *H01J 37/32183* (2013.01); *H01J 37/32724* (2013.01); *H01J 2237/20214* (2013.01); *H01J 2237/335* (2013.01); *H01J 2237/3342* (2013.01)

(58) Field of Classification Search
CPC ......... H01L 21/02079; H01L 21/68764; H01L 21/02087; H01L 21/0209; H01L 21/02274; H01L 21/67253; H01L 21/02115; H01L 21/67028; H01L 21/31122; C23C 16/4584; C23C 16/50; H01J 37/32715; H01J 37/32532; H01J 37/3244; H01J 2237/20214; H01J 2237/335; H01J 37/32091; H01J 2237/3342; H01J 37/32183; H01J 37/32724; H01J 37/32174; B08B 7/0035
USPC ............. 216/67, 68, 71; 156/345.43, 345.44, 156/345.45, 345.47, 345.51
See application file for complete search history.

(56) References Cited

U.S. PATENT DOCUMENTS

| 2005/0178505 | A1* | 8/2005 | Kim | H01J 37/32009 156/345.47 |
| 2011/0042007 | A1* | 2/2011 | Imai | H01J 37/32018 156/345.24 |
| 2012/0273134 | A1* | 11/2012 | Sexton | B08B 7/0035 156/345.33 |

FOREIGN PATENT DOCUMENTS

| JP | 2011511437 A | 4/2011 |
| WO | 2009097089 A2 | 8/2009 |

* cited by examiner

*Primary Examiner* — Lan Vinh
(74) *Attorney, Agent, or Firm* — Dorsey & Whitney LLP

(57) ABSTRACT

Examples of a substrate processing apparatus include a stage, a driving unit for rotating the stage, an electrode facing only a part of an outer edge of the stage, a high-frequency power supply unit for supplying high-frequency power to the electrode, and a gas supply device for supplying gas to a gap between the electrode and the stage.

9 Claims, 5 Drawing Sheets

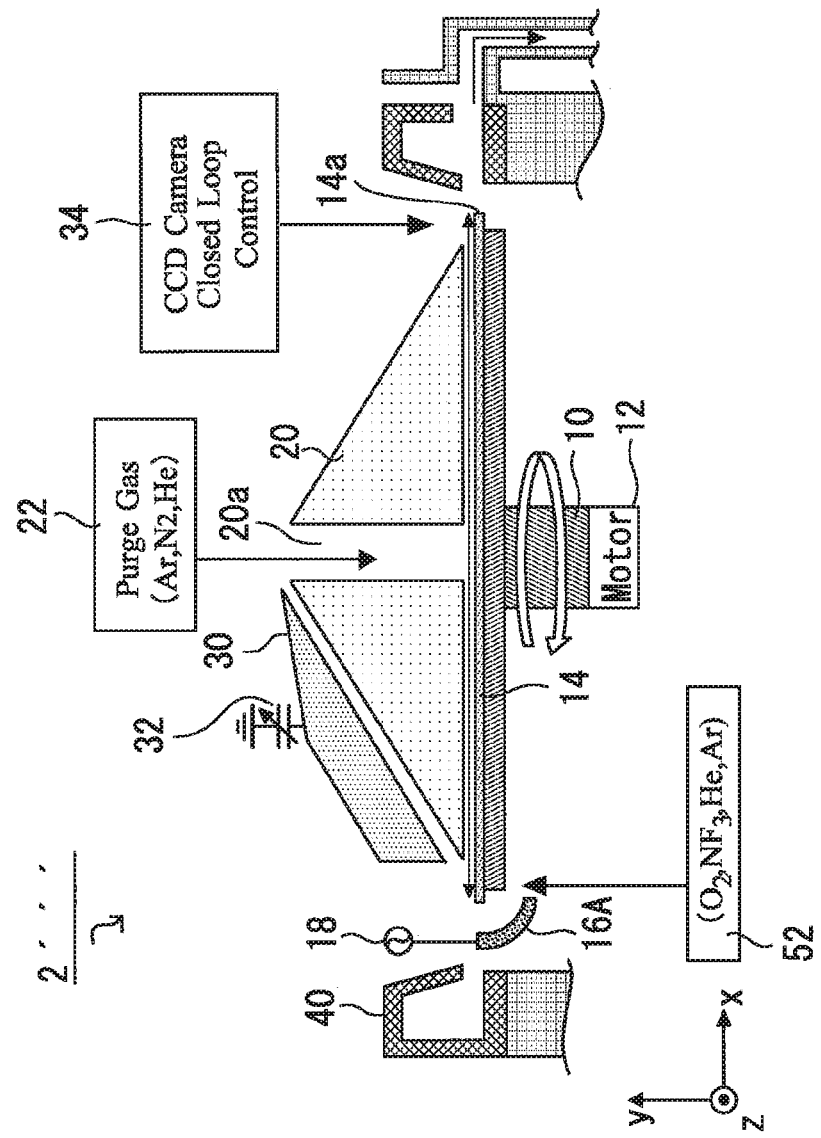

SUBSTRATE PROCESSING APPARATUSES AND SUBSTRATE PROCESSING METHODS

TECHNICAL FIELD

Examples are described which relate to a substrate processing apparatus and a substrate processing method using the substrate processing apparatus.

BACKGROUND

In a semiconductor or liquid crystal manufacturing process, a peripheral portion or back surface of a substrate comes into mechanical contact with a hand of a transfer robot. When the hand of the transfer robot comes into contact with, for example, a thin film deposited on a side surface portion of the substrate, the thin film peels off, resulting in occurrence of particles. These minute particles bring an electrical trouble to a highly integrated device, and cause serious yield reduction. In addition, a conductive film which is formed so as to creep around the peripheral portion of the back surface of the substrate disturbs electrostatic adsorption of the substrate, or generates a DC current penetrating vertically through the substrate, thereby causing damage to elements in a subsequent process.

Selective removal of a film on the periphery of a substrate is considered as a method of preventing particles occurring due to mechanical contact with the peripheral portion of the substrate. For example, reaction gas is made to flow to the peripheral portion of the substrate, and high-frequency power is applied to the electrode provided above the peripheral portion to generate plasma around the peripheral portion. In this method, an extremely small interval between the electrodes is set in order to prevent diffusion of gas directed to the center of the substrate and wraparound of plasma. An ignition voltage of plasma is represented by a function of the product p*d of the internal pressure p of a reactor and the electrode interval d according to the Paschen's law. Since the ignition voltage of plasma is proportional to 1/d, the ignition voltage increases when d is extremely small, so that it is difficult to obtain uniform and stable plasma. Therefore, film formation or film removal at the peripheral portion of the substrate is non-uniform, which adversely affects the yield.

SUMMARY

Some examples described herein may address the above-described problems. Some examples described herein may provide a substrate processing apparatus and a substrate processing method that can perform stable plasma processing on an edge of the substrate or a portion near to the edge.

In some examples, a substrate processing apparatus includes a stage, a driving unit for rotating the stage, an electrode facing only a part of an outer edge of the stage, a high-frequency power supply unit for supplying high-frequency power to the electrode, and a gas supply device for supplying gas to a gap between the electrode and the stage.

BRIEF DESCRIPTION OF THE DRAWINGS

FIG. 6 is a diagram showing a configuration example of a substrate processing apparatus according to another example.

DETAILED DESCRIPTION

A substrate processing apparatus and a substrate processing method according to some examples will be described with reference to the drawings. The same or corresponding constituent elements are represented by the same reference signs, and duplicative descriptions thereof may be omitted.

Figure 1:
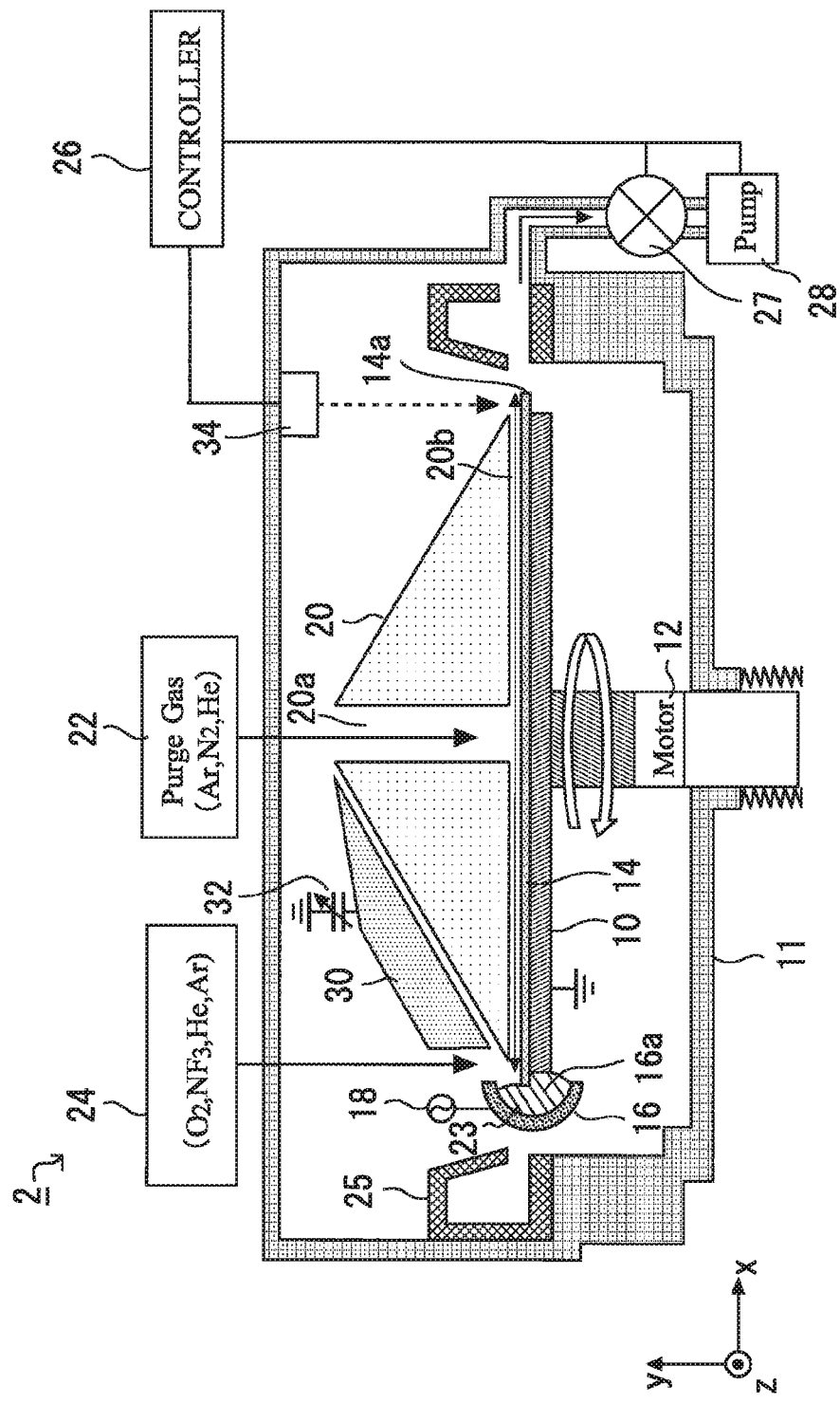
FIG. 1 is a diagram showing a configuration example of a substrate processing apparatus.

FIG. 1 is a diagram showing a configuration example of a substrate processing apparatus 2. The substrate processing apparatus includes a stage 10 housed in a chamber 11. The stage 10 may be an electrode, such as an electrostatic chuck electrode (ESC electrode). The stage 10 may be a temperature-adjustable susceptor. This stage 10 may be rotated by a driving unit 12. The driving unit 12 rotates the stage 10 with a y-axis as a rotation axis. In an example, the driving unit 12 can be a motor. The stage 10 may be rotated by various methods.

A substrate 14, which is a target for substrate processing, is placed on the stage 10. The diameter of the substrate 14 is larger than the diameter of the stage 10. For example, the diameter of the substrate 14 can be 300 mma and bigger than the stage 10. Therefore, the edge of the substrate and a peripheral portion 14a thereof extending from the edge are not supported by the stage 10. The substrate 14 can be a material for manufacturing a semiconductor device or liquid crystal.

The substrate processing apparatus 2 can include an electrode 16 that is provided beside the stage 10. The shape of the electrode 16 can be an arc-shape. The substrate processing apparatus 2 can also include an AC power supply 18 to supply high-frequency power to the electrode 16 can connected to the electrode 16.

Figure 2:
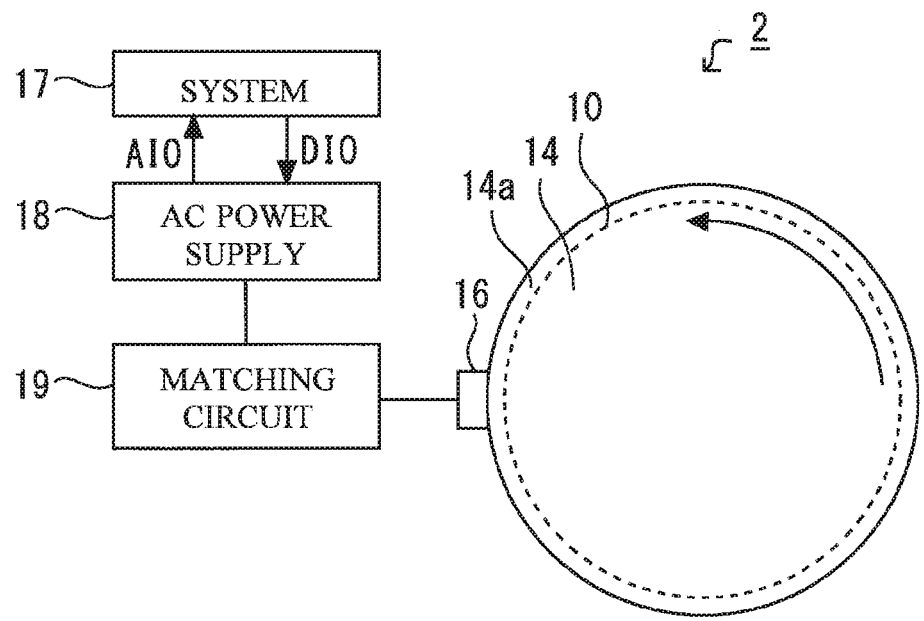
FIG. 2 is a plan view of the stage and the electrode.

FIG. 2 is a plan view of a portion of the substrate processing apparatus 2 of FIG. 1 showing at least the stage 10, the substrate 14, and the electrode 16. The outer edge of the stage 10 is indicated by a broken line. The electrode 16 faces only a part of the outer edge of the stage 10. In other words, the electrode 16 does not surround the stage 10. The distance between the electrode 16 and stage 10 may be equal to or more than 10 mm. In some examples, electrode 16 faces ½₀ of outer edge of the stage 10 or less.

FIG. 2 shows that the substrate processing apparatus 2 can also include a system 17, the AC power supply 18 (e.g., an RF generator), and a matching circuit 19 are provided to apply high-frequency power to the electrode 16, for example. The AC power supply 18 can receive an instruction from the system 17 to supply high frequency power to the electrode 16 via the matching circuit 19. It is noted that the system 17, the AC power supply 18 and the matching circuit 19 are one example of a high-frequency power supply unit to supply high-frequency power to the electrode 16 and that substrate processing apparatus 2 can include any other suitable high-frequency power supply unit instead of or in conjunction with at least one of the system 17, the AC power supply 18, and the matching circuit 19.

Referring back to FIG. 1, the substrate processing apparatus 10 can include a mask block 20 to prevent removal of material from a portion of the substrate 14 during operation. The mask block 20 is provided above the stage 10 so as to be apart from the stage 10. The material of the mask block 20 may be an insulator (e.g., a ceramic material) or any other suitable material. The distance between the mask block 20 and the stage 10 is greater than the thickness of the substrate 14. In an example, the distance between the mask block 20 and the stage 10 may be at least 1 mm, 1 to 3 mm, or 1 to 5 mm. The mask block 20 can define a through-hole 20a extending vertically therethrough. The through-hole 20a is supplied with purge gas from a purge gas supply device 22 for example through the tube that couples the purge gas supply device 22 to the through-hole 20a. As a result, the purge gas is supplied via the through-hole 20a into a space 20b formed between and defined by at least two of the stage 10, the substrate 14, or the mask block 20. The purge gas may flow radially, relative to the stage 10, through the space 20b. The purge gas supplied by the purge gas supply device 22 can be Ar, $N_2$ or He.

The substrate processing apparatus 2 can include a gas supply device 24 to supply a gas into the gap 23 formed between and defined by the electrode 16 and the stage 10 for example through the tube. The gas supply device 24 can supply an etching gas (e.g., $O_2$, $NF_3$, He or Ar) or material gas used for film formation to the gap 23.

Gas flow rates of the gas from the gas supply device 24 and the purge gas from the purge gas supply device 22 can be controlled by a mass flow controller (not shown), the system 17, the controller 26, or any other suitable controller. The mass flow controller may be communicably coupled to and at least partially control the operation of the gas supply device 24 or the purge gas supply device 22.

The substrate processing apparatus 2 can include an exhaust duct 25 that may exhaust the purge gas supplied from the purge gas supply device 22 and the gas supplied from the gas supply device 24. The substrate processing apparatus 2 can also include a control valve 27 and an exhaust pump 28 that are at least partially controlled by a controller 26, thereby optimizing the pressure in a chamber 11. For example, the control valve 27 and the exhaust pump 28 are controlled so that the gas supplied from the gas supply device 24 is mainly filled in the chamber 11. The exhaust duct 25, the control valve 27, and the exhaust pump 28 can collectively form an exhaust passage.

The substrate processing apparatus 2 can include an impedance adjusting electrode 30 that is provided to face the electrode 16. The impedance adjusting electrode 30 is grounded via a variable capacitor 32. The impedance adjusting electrode 30 can be provided above or below the stage 10. The impedance adjusting electrode 30 provides a ground line that is different than the stage 10, is proximate to the electrode 16, and functions as a discharge plug. High-frequency impedance, which can be modified (e.g., optimized) to improve stability of discharge, can be created by adjusting the capacity of the variable capacitor 32.

The substrate processing apparatus 2 can include a measuring device 34 that is provided above the stage 10. The measuring device 34 can be at least one of a camera, a thermometer or a film thickness measuring device. The measuring device 34 is provided to observe the peripheral portion 14a of the substrate 14 from an upper side. The peripheral portion of the substrate 14 is an annular portion extending along the edge in the substrate 14. For example, completion of film removal or completion of film formation at the peripheral portion 14a is monitored on a real-time basis by the measuring device 34.

An example of a substrate processing method using the substrate processing apparatus 2 of FIGS. 1 and 2 can include placing a substrate 14 having a larger diameter than the stage 10 on the stage 10. As a result, the peripheral portion 14a of the substrate 14 protrudes from the outer edge of the stage 10 as shown in FIGS. 1 and 2. For example, the substrate 14 is brought into close contact with the stage 10 by the electrostatic chuck of the stage 10 which can precisely position of the substrate 14 on the stage 10 and stabilize discharge from the electrode 16.

Next, the stage 10 is rotated while the substrate processing apparatus 2 generates plasma 16a between the electrode 16 and the stage 10. For example, high-frequency power is supplied from the AC power supply 18 to the electrode 16 and a gas is supplied to the gap 23 between the electrode 16 and the stage 10 from the gas supply device 24 to generate plasma. The electrode 16 and the stage 10 can constitute two capacitively-coupled electrodes, thereby generating capacitive coupling plasma. The electrode 16 can function as a compact discharge plug. The diameter of the stage 10 is set to be smaller than the outer diameter of the substrate 14, thereby exposing the peripheral portion 14a of the back surface of the substrate 14 to the plasma.

Stable plasma is generated by adjusting an discharge condition for the electrode 16. For example, the impedance can be locally changed by the impedance adjusting electrode 30 and the variable capacitor 32 to facilitate generation of the plasma and stabilize the plasma. For instance, the variable capacitor 32 can be adjusted to enable optimization of the impedance.

During execution of the plasma processing, the purge gas is supplied from the purge gas supply device 22 to the through-hole 20a of the mask block 20 to flow the purge gas radially through the space 20b between at least two of the stage 10, the substrate 14, or the mask block 20. As a result, the gas supplied from the gas supply device 24 can be substantially prevented from reaching the upper surface of the substrate 14. Significant plasma processing can be substantially reduced and/or avoided on the upper surface side of the substrate 14 by the mask block 20 and the purge gas provided by the purge gas supply device 22.

The peripheral portion 14a of the substrate 14 is successively subjected to plasma processing while the substrate 14 is rotated as indicated by an arrow in FIG. 2 by the driving unit 12. The plasma processing can either cause the film formed on the side surface and back surface of the substrate 14 to be removed or cause a film to be formed on the side surface and back surface of the substrate 14. The peripheral portion 14a of the substrate 14 is subjected to plasma processing with stable plasma, whereby it is possible in some examples to perform uniform film formation (and/or film formation with improved uniformity) or uniform film removal (and/or film removal with improved uniformity).

Furthermore, the state of the peripheral portion 14a of the substrate 14 can be monitored by the measuring device 34. For example, it can be checked whether the film at the peripheral portion 14a has been removed, or it can be checked whether the film formation has been performed at the peripheral portion 14a on a real-time basis. In order to enable such monitoring, the mask block 20 can be provided except for the position just above the peripheral portion 14a.

Figure 3:
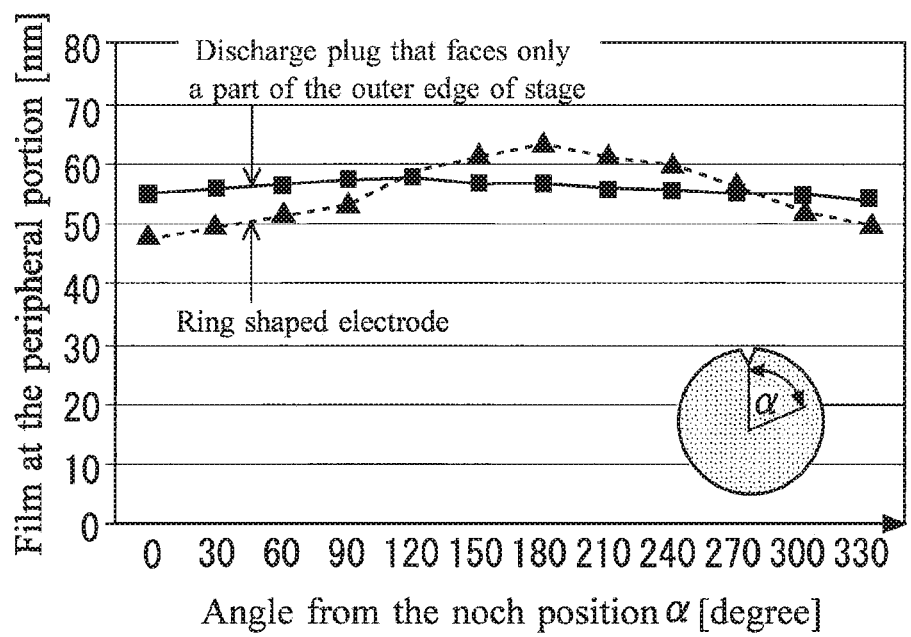
FIG. 3 is a graph showing an influence of the shape of the electrode on a processing result.

FIG. 3 is a graph showing an influence of the shape of the electrode on a processing result. In the example of FIG. 3, the outer diameter of the stage, which functions as a ground-side electrode, is set to 295 mm. A substrate having a diameter of 300 mm and formed of silicon is placed on the stage. The substrate includes a film of amorphous carbon formed thereon. In this example, a film at the peripheral portion of the substrate 14 is removed by plasma of oxygen gas for 10 minutes.

In an embodiment, the electrode of the substrate processing apparatus includes a discharge plug having a width of 40 mm that is formed of aluminum. High-frequency power is applied to the discharge plug to cause discharge while the stage is rotated, whereby the whole peripheral portion of the substrate is subjected to plasma processing. The film thickness profile that is detected after using the discharge plug is indicated by the solid line shown FIG. 3. In an embodiment, the electrode of the substrate processing apparatus includes ring-shaped electrode surrounding the stage that is formed of aluminum and faces the whole outer edge of the stage. High-frequency power is applied to the ring-shaped electrode to cause discharge while the stage is rotated/remains stationary, whereby the whole peripheral portion of the substrate is subjected to plasma processing. The film thickness profile that is detected after using the ring-shaped electrode is indicated by the broken line shown FIG. 3.

Both of the data of the solid line and the data of the broken line in FIG. 3 are measured at an inside position that is 2 mm from the outer edge of the substrate. In both the cases, the distance between the electrodes (e.g., the discharge plug or the ring-shaped electrode) and the stage 10 is set to 12 mm, and the frequency of the high-frequency power to be applied to the electrode is set to 13.56 MHz.

From the comparison between the solid line and the broken line of FIG. 3, it is apparent that in-plane uniformity of the film thickness is enhanced by providing the discharge plug that faces only a part of the outer edge of the stage as compared with a case where a ring-shaped electrode surrounding the stage is used. Accordingly, in some examples, referring back to FIGS. 1 and 2, the electrode 16 should be made to face only a part of the outer edge of the stage 10, and not to surround the stage 10. When the ring-shaped electrode surrounding the stage 10 is used as the electrode 16, it may be difficult to obtain a gas flow and plasma which are uniform over the whole portion at which the electrode 16 and the stage 10 face each other, and the thickness of carbon film varies greatly according to the position. On the other hand, it is possible in some examples to cause stable discharge at limited place using the ring-shaped electrode as the electrode 16 and thus perform film removal with improved uniformity, such as when the electrode 16 is made compact and made to face only a part of the outer edge of the stage 10.

Figure 4:
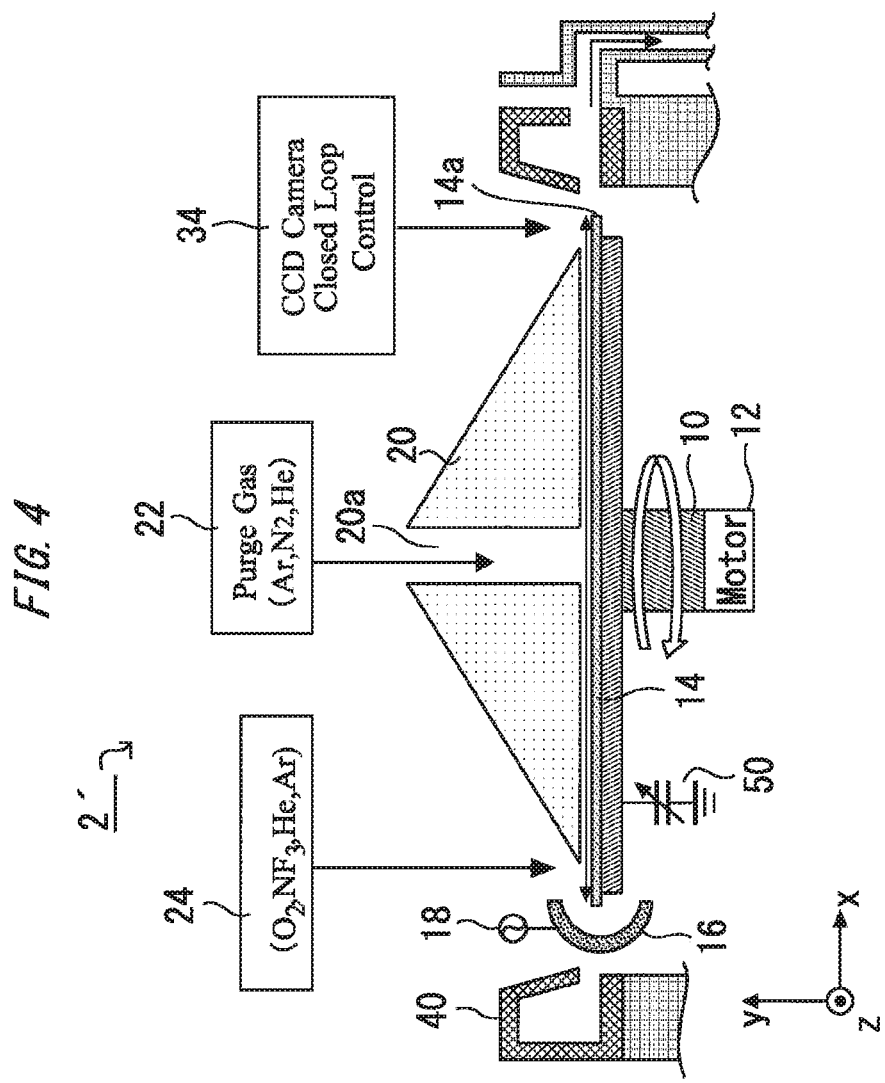
FIG. 4 is a diagram showing a configuration example of a substrate processing apparatus according to another example.

FIG. 4 is a diagram showing a configuration example of a substrate processing apparatus 2' according to another example. Except as otherwise disclosed herein, the substrate processing apparatus 2' can be the same or substantially similar to any of the substrate processing apparatuses disclosed herein. Referring to FIG. 4, the stage 10 is grounded via a variable capacitor 50. By adjusting the capacitance of the variable capacitor 50, impedance can be adjusted (e.g., optimized) when the plasma is generated.

Figure 5:
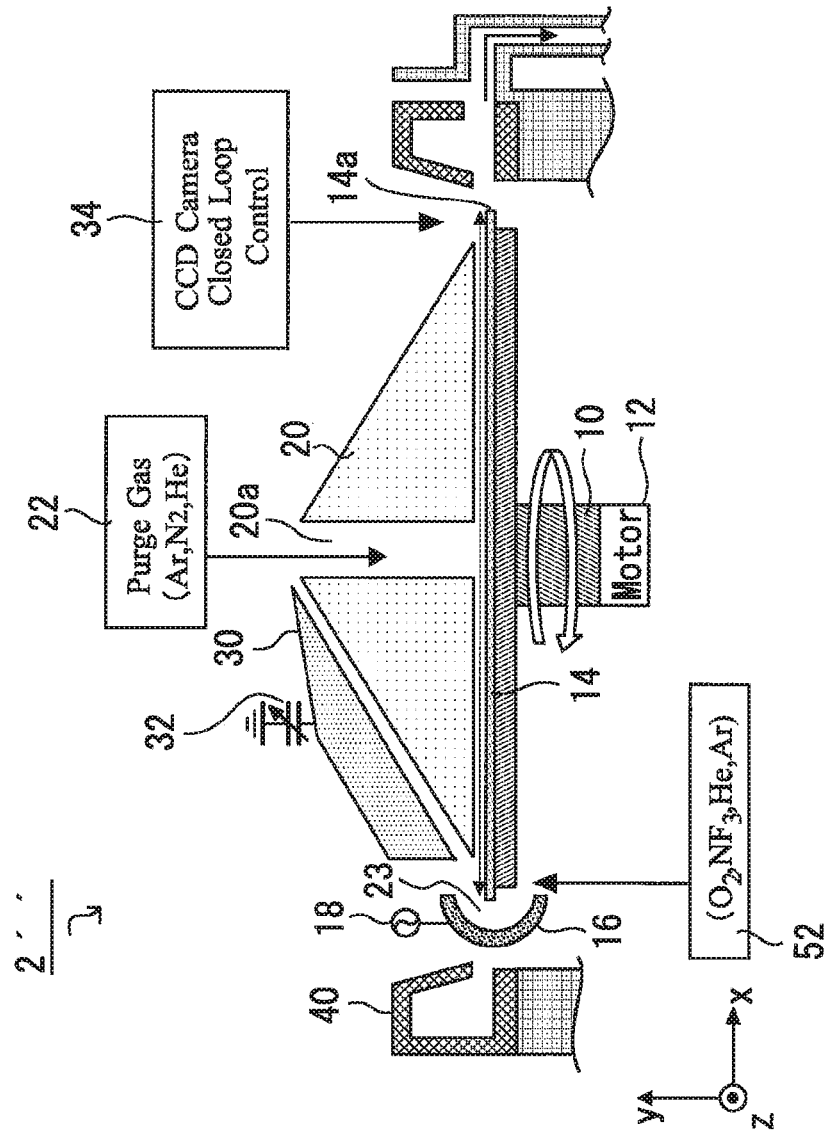
FIG. 5 is a diagram showing a configuration example of a substrate processing apparatus according to another example.

FIG. 5 is a diagram showing a configuration example of a substrate processing apparatus 2' according to another example. Except as otherwise disclosed herein, the substrate processing apparatus 2''' can be the same or substantially similar to any of the substrate processing apparatuses disclosed herein. Referring to FIG. 5, gas is supplied from a lower side of the stage 10 into the gap 23 between the electrode 16 and the stage 10 by the gas supply device 52. As a result, sufficient gas can be supplied from the gas supply device 52 to the back surface side of the substrate 14, so that intended plasma processing can be performed particularly on the back surface of the substrate 14.

FIG. 6 is a diagram showing a configuration example of a substrate processing apparatus 2''' according to another example. Except as otherwise disclosed herein, the substrate processing apparatus 2''' can be the same or substantially similar to any of the substrate processing apparatuses disclosed herein. Referring to FIG. 6, an electrode 16A is provided at one or more of the same level as the substrate 14, the upper end of the stage 10, or only below the upper end. As a result, plasma mainly occurs beside the side surface of a substrate 14 and below the back surface of the substrate 14. In this case, plasma processing can be performed on the side surface and back surface of the substrate 14 while plasma processing on the upper surface of the substrate 14 can be sufficiently suppressed. The shape of the electrode may be changed or the distance between the electrode and the stage 10 may be adjusted by other methods.

The invention claimed is:

1. A substrate processing apparatus comprising:
   a stage;
   a driving unit for rotating the stage;
   an electrode facing only a part of an outer edge of the stage;
   a high-frequency power supply unit for supplying high-frequency power to the electrode;
   a gas supply device for supplying gas from above or below the stage without penetrating the electrode to a gap between the electrode and the stage; and
   an impedance adjusting electrode that faces the electrode and is grounded via a variable capacitor.

2. The substrate processing apparatus according to claim 1, further comprising:
   a mask block provided above the stage so as to be apart from the stage; and
   a purge gas supply device for supplying purge gas to a space between the stage and the mask block to generate a gas flow traveling radially relative to the stage.

3. The substrate processing apparatus according to claim 1, wherein the shape of the electrode is an arc-shape.

4. The substrate processing apparatus according to claim 1, wherein the impedance adjusting electrode is provided above the stage.

5. The substrate processing apparatus according to claim 1, further comprising a measuring device provided above the stage.

6. The substrate processing apparatus according to claim 5, wherein the measuring device is a camera, a thermometer or a film thickness measuring device.

7. A substrate processing method comprising:
   placing, on a stage, a substrate having a larger diameter than the stage; rotating the stage while plasma is generated in a gap between an electrode facing only a part of an outer edge of the stage and the stage by supplying high-frequency power to the electrode and supplying gas to the gap from above or below the stage without penetrating the electrode; and
   adjusting an impedance with an impedance adjusting electrode that faces the electrode and is grounded via a variable capacitor.

8. The substrate processing method according to claim 7, wherein the plasma removes a film formed on a side surface and a back surface of the substrate.

9. The substrate processing method according to claim 7, wherein the plasma forms film on a side surface and a back surface of the substrate.

* * * * *